(12) United States Patent
Bentley

(10) Patent No.: US 6,380,608 B1
(45) Date of Patent: Apr. 30, 2002

(54) MULTIPLE LEVEL SPIRAL INDUCTORS USED TO FORM A FILTER IN A PRINTED CIRCUIT BOARD

(75) Inventor: Ronald L. Bentley, Santa Rosa, CA (US)

(73) Assignee: Alcatel USA Sourcing L.P., Plano, TX (US)

( * ) Notice: Subject to any disclaimer, the term of this patent is extended or adjusted under 35 U.S.C. 154(b) by 0 days.

(21) Appl. No.: 09/323,311

(22) Filed: Jun. 1, 1999

(51) Int. Cl.[7] .......................... H01L 47/00; H01L 29/00
(52) U.S. Cl. ................................ 257/531; 257/3; 257/4; 257/528
(58) Field of Search ................................ 257/528, 531, 257/3, 4, 52

(56) References Cited

U.S. PATENT DOCUMENTS

| | | | |
|---|---|---|---|
| 5,075,650 A | 12/1991 | Okamura et al. | ............ 333/177 |
| 5,095,357 A | 3/1992 | Andoh et al. | ................. 357/51 |
| 5,157,576 A | * 10/1992 | Takaya et al. | .............. 361/321 |
| 5,446,311 A | 8/1995 | Ewen et al. | |
| 5,610,433 A | * 3/1997 | Merrill et al. | ............... 257/531 |
| 5,656,849 A | 8/1997 | Burghartz et al. | ........... 257/528 |
| 5,849,355 A | * 12/1998 | McHenry | ..................... 427/79 |
| 5,914,525 A | 6/1999 | Yoshida et al. | |
| 5,969,590 A | * 12/1999 | Gutierrez | ..................... 336/200 |

FOREIGN PATENT DOCUMENTS

| | | | |
|---|---|---|---|
| GB | 1116161 | 6/1968 | ................. 336/200 |
| JP | 3-283404 | 3/1990 | ................. 336/200 |
| JP | 3-183106 | 8/1991 | ................. 336/200 |
| JP | 405109923 | 4/1993 | |
| JP | 5-205943 | 8/1998 | ................. 336/200 |

\* cited by examiner

*Primary Examiner*—Eddie Lee
*Assistant Examiner*—Jesse A. Fenty
(74) *Attorney, Agent, or Firm*—Jackson Walker LLP; Richard A. Mysliwiec; V. Lawrence Sewell

(57) ABSTRACT

Spiral inductors are provided on multiple internal layers of a printed circuit (PC) board and configured to form a filter. An external end of each of the spiral inductors can be coupled by a via to opening in ground planes provided on external surfaces of the PC board. Using such vias, the external end of each of the spiral inductors can be coupled by lumped elements, such as a capacitor, an inductor, or combination of capacitors and inductors to the ground planes to enable tuning of the filter after the PC board has been manufactured. Such lumped element components can further interconnect the external ends of two spiral inductors to provide alternate filter configurations which are easily tunable. Internal ends of the spiral inductors can also be connected together by a via to the ground planes to provide superb grounding due to limited line lengths between filter components and ground.

50 Claims, 9 Drawing Sheets

MULTIPLE LEVEL SPIRAL INDUCTORS USED TO FORM A FILTER IN A PRINTED CIRCUIT BOARD

BACKGROUND OF THE INVENTION

1. Field of the Invention

The present invention relates to filter circuits, and more particularly filter circuits using stacked spiral inductors.

2. Description of the Background Art

Printed circuit (PC) boards typically include multiple dielectric layers having metal deposited on surface regions, the dielectric layers being laminated together. Conductive metal regions on the outer dielectric layers of the PC boards may include large metal regions to provide ground planes for signal lines on other layers, and may further be etched to provide lines for carrying signals.

The outer dielectric layers of the PC board typically support lumped elements such as capacitors or inductors. Although inner dielectric layers do not typically support such lumped components, conductive metal regions may be etched on the inner dielectric layers to form elements such as inductors and capacitors. Inductors can be created by forming a line in a spiral pattern, while capacitors can be created using two metal regions separated by a gap.

To take advantage of self coupling between windings of an individual spiral inductor, as well as mutual coupling between windings of separate spiral inductors, spiral inductors may be stacked. U.S. Pat. No. 5,656,849, entitled "Two-Level Spiral Inductor Structure Having A High Inductance To Area Ratio" by Burghartz et al., discloses stacking spiral inductors in layers of an integrated circuit device to form an inductor which occupies minimal space and takes advantage of the added mutual inductance between the stacked inductors.

SUMMARY OF THE INVENTION

The present invention utilizes multiple conductive layers separated by dielectric material in a PC board to provide a filter including stacked spiral inductors.

The present invention further utilizes spiral inductors provided between layers of a PC board in combination with lumped element capacitors, inductors, or a combination of capacitors and inductors provided on an external surface of the PC board to create a tunable filter which occupies a minimal amount of space.

The present invention includes stacked spiral inductors with an external end of each of the spiral inductors coupled by a via to openings in ground planes provided on external surfaces of the PC board. Components such as capacitors, inductors, or combinations of capacitors and inductors can be used to couple the vias connected to the external ends of the spiral inductors to one or more of the ground planes. The lumped element components can be attached to outer dielectric layers of the PC board and altered to enable tuning of the filter after manufacture of the PC board. The lumped elements can also be connected from the external end of one spiral inductor to the external end of another spiral inductor to create additional filter configurations.

Internal ends of the spiral inductors are further connected together by a via. The internal ends of each of the spiral inductors can further be connected to ground planes provided on outer surfaces of the PC board. With the internal ends of the stacked spiral inductors connected by a via to a ground plane, superb grounding is provided which can significantly limit ground bounce noise relative to filters with components connected in a planar fashion which have longer lines connecting filter components to ground.

Metallization can be provided on layers of the PC board between spiral inductors to alter the coupling between the spiral inductors and provide alternative filter configurations. In one such configuration, a simple transmission line is provided on a layer between the spiral inductors. One end of the transmission line is connected to a via connecting the internal ends of the spiral inductors, while a second end of the transmission line is connected by a via to ground plane regions on external layers of the PC board. Such a transmission line will be inductively coupled to the spiral inductors and will provide isolation between the spiral inductors and ground.

The spiral inductors can further be located to overlap to maximize mutual coupling, or located to not overlap to reduce mutual coupling to provide alternative filter structures. In one configuration, a first pair of spiral inductors are positioned to overlap, a second pair of spiral inductors are further positioned to overlap, while the first and second pairs do not overlap. Such a structure provides a filter made up of two connected transformers.

BRIEF DESCRIPTION OF THE DRAWINGS

Further details of the present invention are explained with the help of the attached drawings in which.

DETAILED DESCRIPTION

Figure 1A:
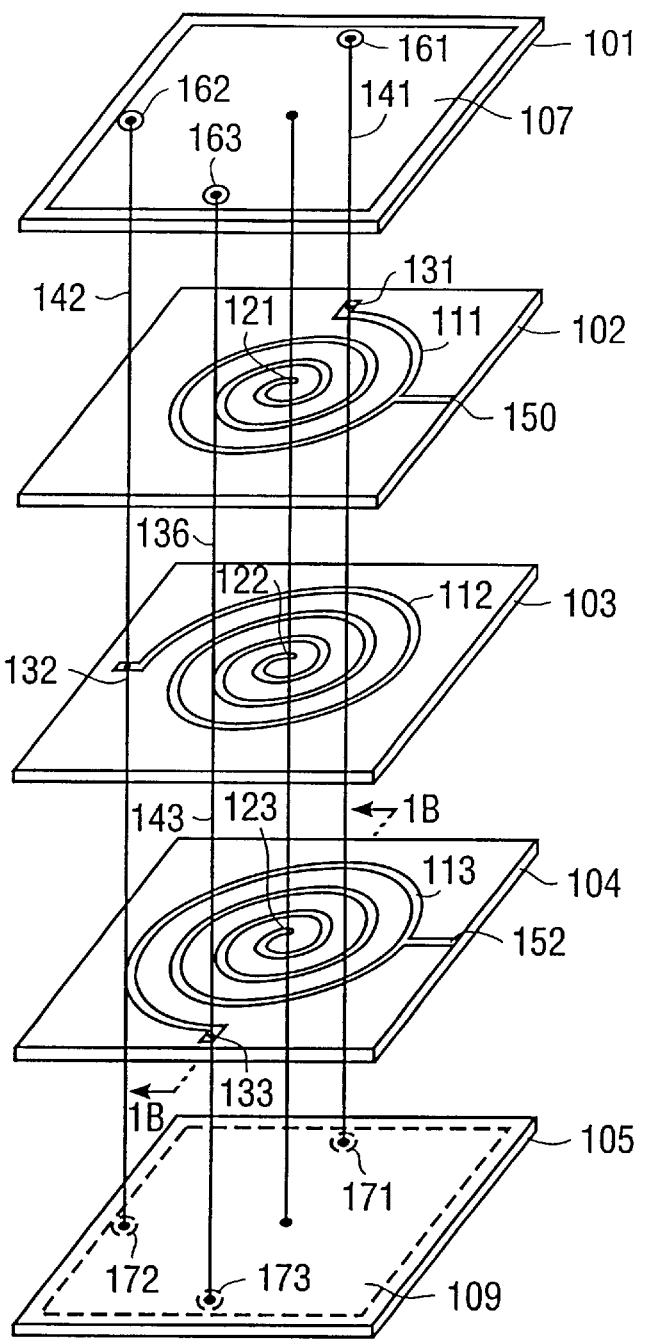
FIG. 1A is an exploded perspective view of components for a filter of the present invention.
Figure 1B:
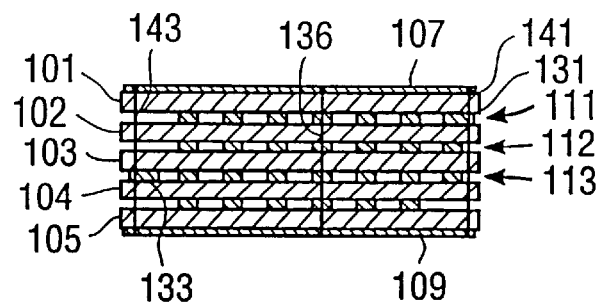
FIG. 1B is a sectional view of the filter of FIG. 1A.

FIGS. 1A and 1B show components of a filter of the present invention as formed on layers of a PC board. The filter includes three dielectric layers 102–104 of a PC board supporting spiral inductors 111–113 formed from conductive material. External ends 131–133 of the spiral inductors 111–113 are connected by vias 141–143 to outer layers 101 and 105 of the PC board.

The outer layers 101 and 105 of the PC board include conductive metal regions 107 and 109. The conductive metal regions 107 and 109 provide ground planes. Openings 161–163 are provided in the conductive metal region 107 around the respective vias 141–143 to enable the vias to be connected by a lumped element component, such as a capacitor or inductor, to the ground plane region 107 as described in more detail subsequently. Similar openings 171–173 are provided in the conductive metal region 109 surrounding vias 141–143.

Although the vias 111–113 are shown provided to both layers 101 and 105 to create symmetry, if such symmetry is not desired, the vias 111–113 can be connected to only one of the layers. With the vias 111–113 provided to both layers 101 and 105, tabs are provided which extend perpendicularly from the external ends 131–133 of the spirals so that a via for one spiral inductor does not pierce a line of an adjacent spiral inductor. If connections are only made by the vias 141–143 to the ground plane region 107, such tabs are not necessary.

Lines 150 and 152 of FIG. 1A form input and output connection terminals for the filter. Although the lines 150 and 152 are shown connected at a particular point on spirals 111 and 113, the lines can be connected at any point on the spirals. The connection point of lines 150 and 152 to the spirals will affect the characteristics of the filter, and can be adjusted by a user to achieve a desired filter response.

Internal ends 121–123 of the spiral inductors 111–113 in FIGS. 1A and 1B are connected together by a single conductive via 136. The internal ends of each of the spiral inductors 111–113 are further shown connected to the ground planes 107 and 109. Although the via 136 is shown connected to both ground planes 107 and 109, if symmetry is not desired, the via 136 may be connected to only one of the ground planes 107 or 109.

With the limited length of the via 136 connecting the internal ends of spirals 111–113 to ground planes 107 and 109, a superb common ground is provided for the internal ends of the spirals 111–113. Such a common ground can reduce ground bounce noise differences between signals on the stacked spiral inductors relative to inductors connected in a planar configuration which require longer ground lines to connect to a common ground.

Figure 2:
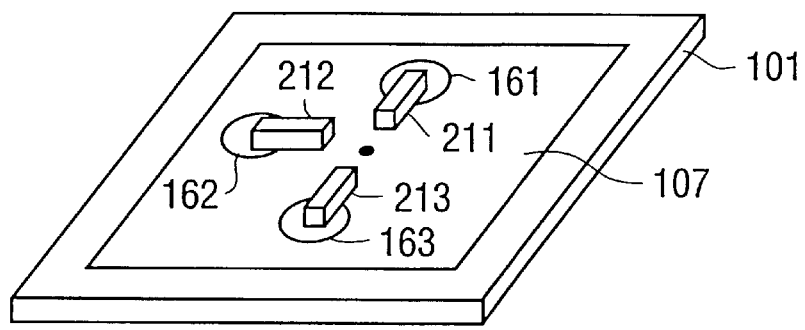
FIG. 2 is a perspective view of a top ground plane for FIG. 1A with the addition of lumped elements.
Figure 3:
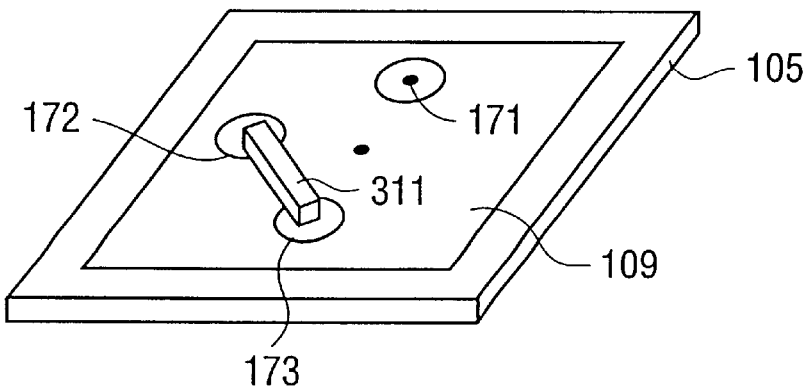
FIG. 3 is a perspective view of a bottom ground plane for FIG. 1A with the addition of lumped elements.

To provide controlled tuning of the filter, the vias 141–143 can be connected with lumped elements as shown in FIGS. 2–3. The layer 101 of FIG. 2 contains lumped elements 211–213 each having a first end connected to one of the vias 141–143. The lumped elements can be either capacitors, inductors, or a combination of capacitors and inductors. The lumped elements can be chips with conductive tabs, one tab of each lumped element being connected to one of the vias 141–143. The lumped elements can also be axial components with wire contacts, one wire of each lumped element being connected to one of the vias 141–143. A second connector of each of the lumped elements 211–213 is connected to the ground plane region 107. The openings 161–163 provided in the ground plane 107 prevent direct grounding of the vias. To tune a filter after manufacture of a PC board, the capacitance or inductance values for the lumped elements 211–213 can easily be adjusted as desired.

FIG. 3 shows outer layer 105 of the PC board containing a lumped element 311. The lumped element 311 illustrates that lumped elements can further be provided to connect two of the vias 141–143 together. The lumped element 311 might be provided on the layer 101, but by providing the lumped element 311 on layer 105, physical crowding of components can be avoided. The lumped element 311 has a first end connected to via 142 and a second end connected to via 143. As with lumped elements 211–213, lumped element 311 can take the form of a capacitor, an inductor, or a combination of capacitors and inductors. The openings 171–173 in the ground plane 109 prevent direct grounding of the vias.

Figure 4:
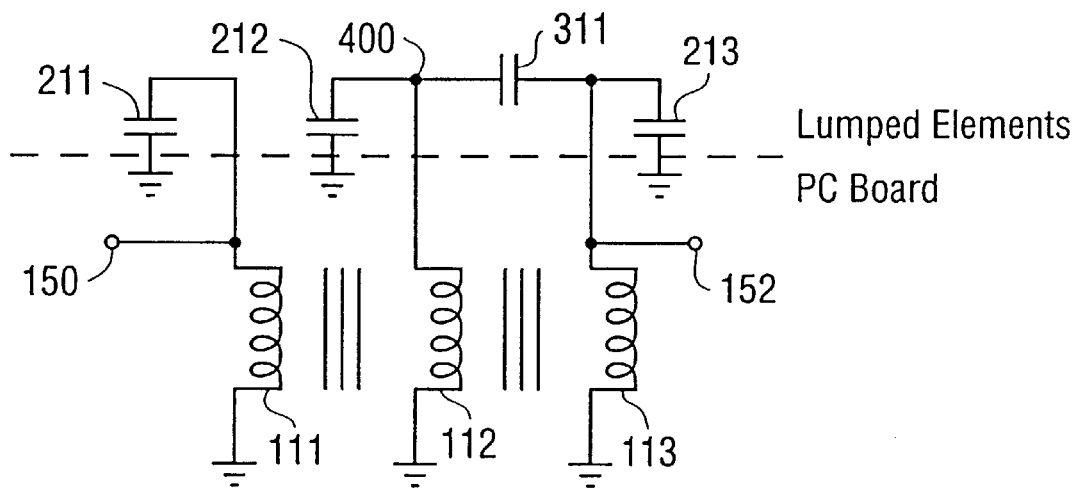
FIG. 4 shows an equivalent circuit for the components of FIGS. 1–3 with capacitors used for the lumped elements.

FIG. 4 shows an equivalent circuit for FIGS. 1A and 1B and FIGS. 2–3 with capacitors used for the lumped elements 211–213 and 311. In FIG. 4, components provided using the PC board are located below the dashed line, while lumped elements attached to the PC board are shown above the dashed line. The spiral inductors 111–113, as shown in FIG. 4, form a three pole filter with power being coupled from an input terminal 150 to an output terminal 152. Capacitor 211 connects in parallel with inductor 111 between ground and terminal 150. Similarly capacitor 213 connects in parallel with inductor 113 between terminal 152 and ground, while capacitor 212 connects in parallel with inductor 112 between node 400 and ground. Capacitor 311 connects node 400 to the terminal 152. By adjusting the values for capacitors 211–213 and 311, the circuit of FIG. 4 can easily be tuned.

Figure 5:
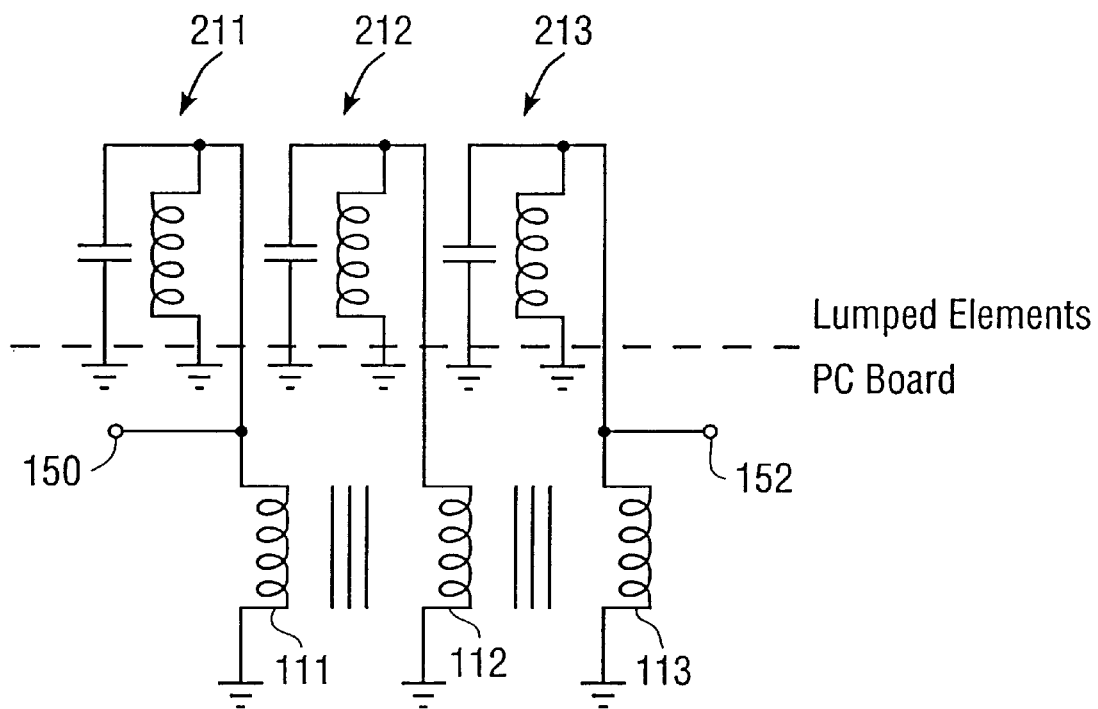
FIG. 5 shows an equivalent circuit for the components of FIGS. 1–2 with a parallel capacitor and inductor used for the lumped elements.

FIG. 5 shows an alternative filter configuration which includes spiral inductors 111–113 of FIGS. 1A and 1B and lumped elements 211–213 of FIG. 2. The lumped element 311 shown in FIG. 3 is not included in the circuit of FIG. 5. Again elements made using the PC board are shown below the dashed line, while lumped elements attached to the PC board are shown above the dashed line. The lumped elements 211–213 are each made from a parallel connected capacitor and inductor. The elements 211–213 of FIG. 5 may each be a single inductor with the parasitic capacitance of the inductor taken into account by the parallel capacitor. FIG. 5 serves to illustrate that multiple components can be used to make up elements 211–213, and those components can be both inductors and capacitors.

Figure 6:
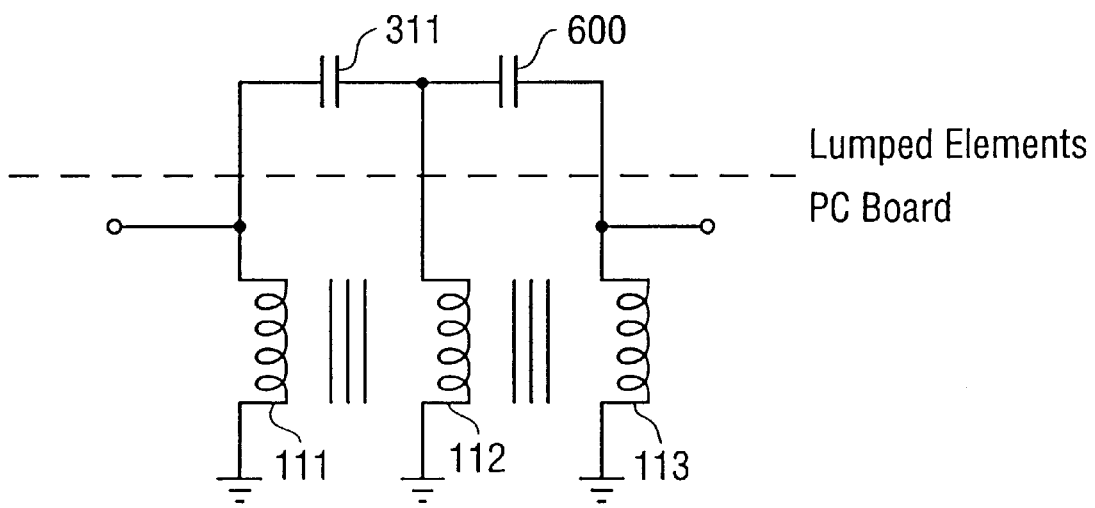
FIG. 6 shows a circuit for the components of FIGS. 1 and 3 and an additional lumped element with capacitors used for the lumped elements.

FIG. 6 shows another filter configuration which includes spiral inductors 111–113 of FIGS. 1A and 1B, lumped element 311 of FIG. 3 and an additional lumped element 600. The lumped elements 311 and 600 are each a capacitor. The lumped elements 211–213 shown in FIG. 2 are not included in the circuit of FIG. 6. The lumped element capacitor 600 connects inductors 111 and 112 together, in a manner similar to lumped element 311 connecting inductors 112 and 113. The lumped element 600 can be provided on a surface of a PC board such as on layer 101 opposite layer 109 if physical limitations prevent placing both elements 311 and 600 on the same dielectric surface. To enable both elements 311 and 600 to contact via 142, a small line or tab can be created from the via to connect to each element 311 and 600 within opening 342. FIG. 6 serves to illustrate that multiple lumped elements can be used to connect the spiral inductors 111–113 together without further connecting the spiral inductors to ground.

In addition to using different lumped elements, turning a filter formed from the components of FIGS. 1A and 1B can be done by taking advantage of self inductance of each of the spiral inductors 111–113, mutual inductance between stacked spiral inductors, and parasitic capacitance between windings of a single inductor or between windings of multiple inductors. For example, a number of dielectric layers could be introduced between spiral inductors, such as between layers 102 and 103 of FIGS. 1A and 1B, to decrease mutual coupling and parasitic capacitance between the spiral inductors. Further, the line width and spacing between lines of an individual spiral inductor can be altered to control inductance and capacitance. Further, the spirals could be offset so they only partially overlap to adjust inductance and capacitance. Additionally, a dielectric layer with a metal ground region to partially overlap the spiral inductors could be introduced between spiral inductors with the amount of overlap between the metal ground region and the spiral inductors adjusted to control capacitance and inductance between the spiral inductors.

Tuning can also be performed after the PC board containing the filter is laminated together by laser etching away the ground planes 107 and 109 by a desired amount. Laser etching away the ground planes 107 and 109 changes the capacitive coupling between the ground planes 107 and 109 and spiral inductors 111–113.

In addition to providing a ground, ground planes 107 and 109 together further serve to isolate the filter formed by spiral inductors 111–113 from other circuitry. By including a filter on internal layers of a PC board between ground planes, such as ground plane regions 107 and 109, significantly less RF noise will leak from the PC board than if a filter is created from discrete components attached to an external layer of a PC board. By including filter components on internal layers of a PC board, reverse engineering of a circuit containing the filter is also much more difficult than with a filter included on an external layer of the PC board.

Figure 7A:
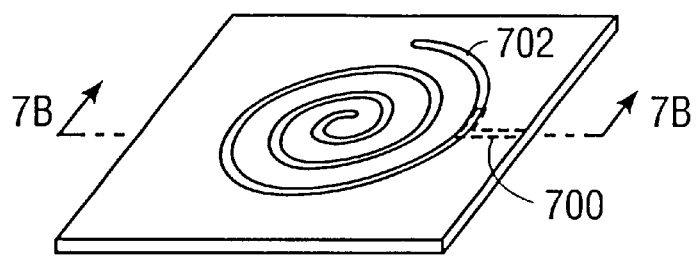
FIG. 7A is a perspective view of a layer of the filter of FIG. 1A modified to include a line for inductively coupling power to a spiral inductor.
Figure 7B:
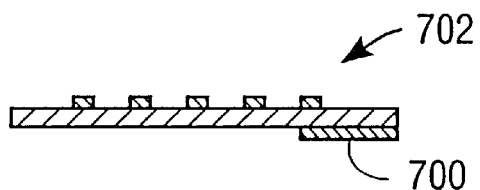
FIG. 7B is a sectional view of FIG. 7A.

Although terminals are shown in FIGS. 1A and 1B in the form of lines 150 and 152 directly connected to spirals 111 and 113, FIGS. 7A and 7B illustrate an alternative to a terminal having a direct connection. In FIGS. 7A and 7B, a terminal line 700 is provided on the opposite side of a dielectric layer from a spiral inductor 702. By overlapping a portion of the spiral inductor 702, the terminal line 700 can inductively couple a signal to or from the spiral inductor 702. By not being provided on the same surface of a dielectric layer as spiral 702, terminal line 700 can cross outer lines of the spiral 702 to launch a signal on an inner line of the spiral if desired.

Figure 8A:
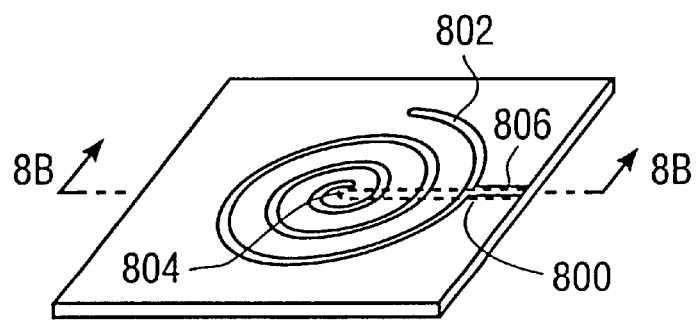
FIG. 8A is a perspective view of a layer of the filter of FIG. 1A modified to include a terminal provided to the internal end of a spiral inductor.
Figure 8B:
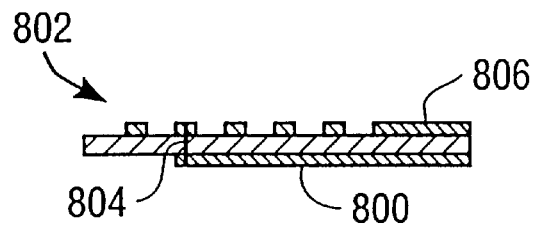
FIG. 8B is a sectional view of FIG. 8A.

FIGS. 8A and 8B illustrate another alternative for providing a terminal to a spiral inductor. In FIGS. 8A and 8B, a terminal line 800 is provided on an opposite side of a dielectric layer from spiral inductor 802 and is directly connected to spiral inductor 802 by a via 804. FIGS. 8A and 8B further show a second terminal line 806 directly connected to spiral inductor 802, similar to terminal lines 150 and 152 of FIG. 1A.

Figure 9:
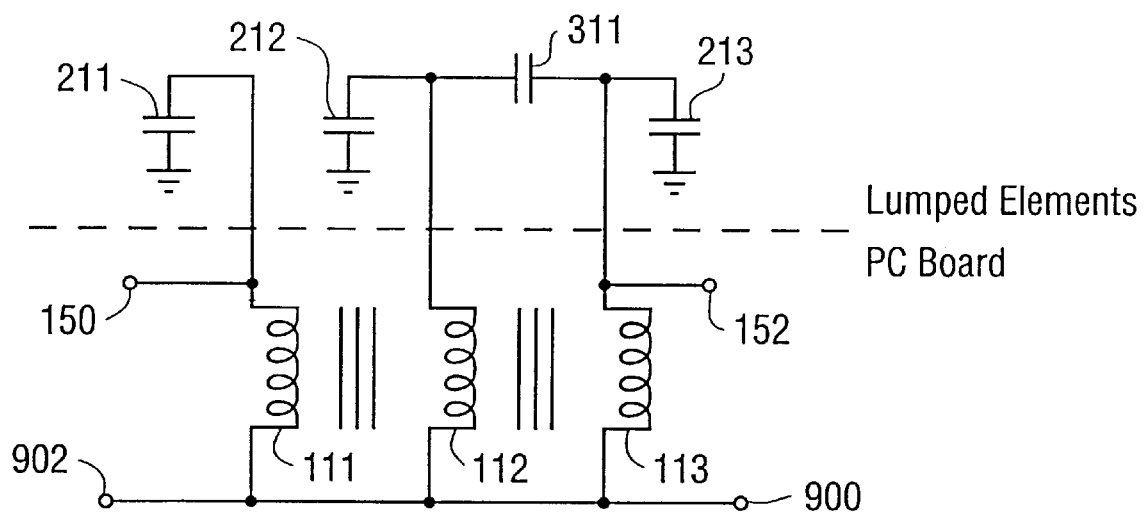
FIG. 9 shows a circuit for the components of FIGS. 1–3 with the internal ends of the spiral inductors of FIGS. 1A and 1B connected to form additional filter terminals.

If terminals at the input and output of the filter of FIG. 1A are desired instead of a ground connection, the connection of via 136 to ground planes 107 and 109 in FIGS. 1A and 1B can be removed, and an additional terminal, such as 800 can be connected to spiral inductor 111 and to spiral inductor 113 to provide two input and two output terminals for the filter of FIG. 1A. FIG. 9 shows the equivalent circuit for such a structure with lumped elements attached as shown in FIGS. 2 and 3. As shown, inductors 111–113 are now connected to terminals 900 and 902 rather than directly to ground as shown in FIG. 4. With terminal connections provided on both sides of dielectric layer 102 in FIGS. 1A and 1B, an additional dielectric layer must be provided between layers 102 and 103 to prevent conductive regions from contacting.

Figure 10:
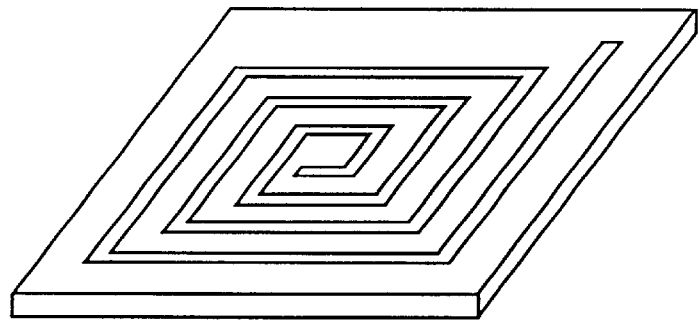
FIG. 10 shows a spiral inductor in a rectangular form.
Figure 11:
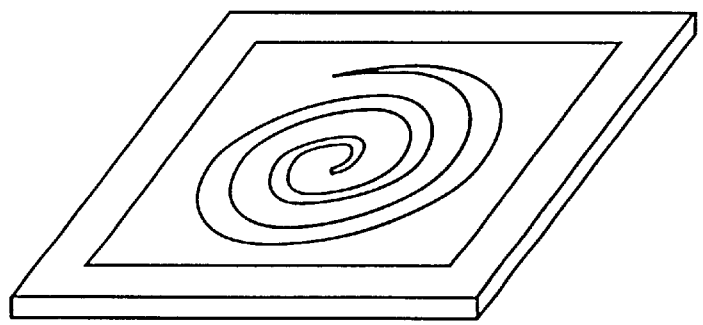
FIG. 11 shows a spiral inductor in an equiangular form with a varying line width and a varying spacing between lines.

Although the spiral inductors, such as 111–113, are shown as generally circular in appearance, the spiral inductors may take one of a number of polyhedral forms. For example, the spiral inductors can be square in form as shown in FIG. 10, rectangular, triangular, or another polyhedral form. Further, although the spiral inductors are shown with a uniform line width and spacing between lines, the line widths and spacing between lines may be altered to achieve desired performance characteristics without departing from the present invention. For example, an equiangular spiral may be utilized as shown in FIG. 11 to provide a constant impedance over a wide range of frequencies if a filter with a large bandwidth is desirable. Note that although the spiral inductors may be referred to as circular in form, CAD tools generally used in the industry create such circular structures using a large number of short straight line segments.

Figure 12:
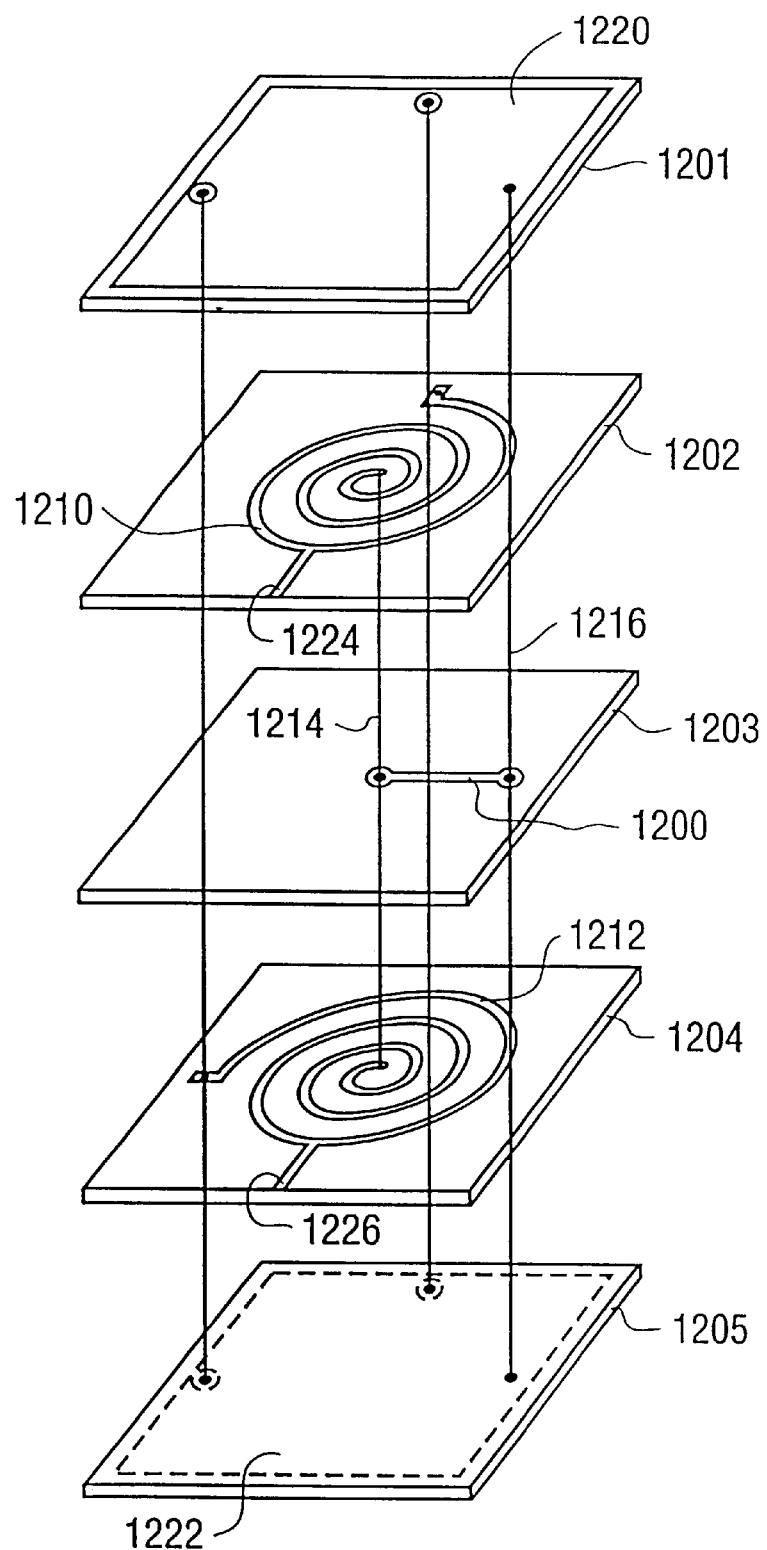
FIG. 12 is an exploded perspective view of components for an additional embodiment of a filter of the present invention which provides isolation of the spiral inductors from ground.

FIG. 12 shows an embodiment of the present invention which provides isolation of the spiral inductors of a filter from ground. FIG. 12 includes a transmission line 1200 provided on a layer 1203 of a PC board between layers 1202 and 1204 containing spiral inductors 1210 and 1212. A first end of the transmission line 1200 is connected by a via 1214 to the internal ends of the spiral inductors 1210 and 1212. A second end of the transmission line 1200 is connected by a via 1216 to ground plane regions 1220 and 1222 provided on external layers 1201 and 1205 of the PC board. External ends of the spiral inductors 1210 and 1212 are connected by vias to openings in the ground plane regions 1220 and 1222, similar to the spiral inductors of FIGS. 1A and 1B. Terminals 1224 and 1226 for the filter are provided by lines directly connected to spiral inductors 1210 and 1212.

Figure 13:
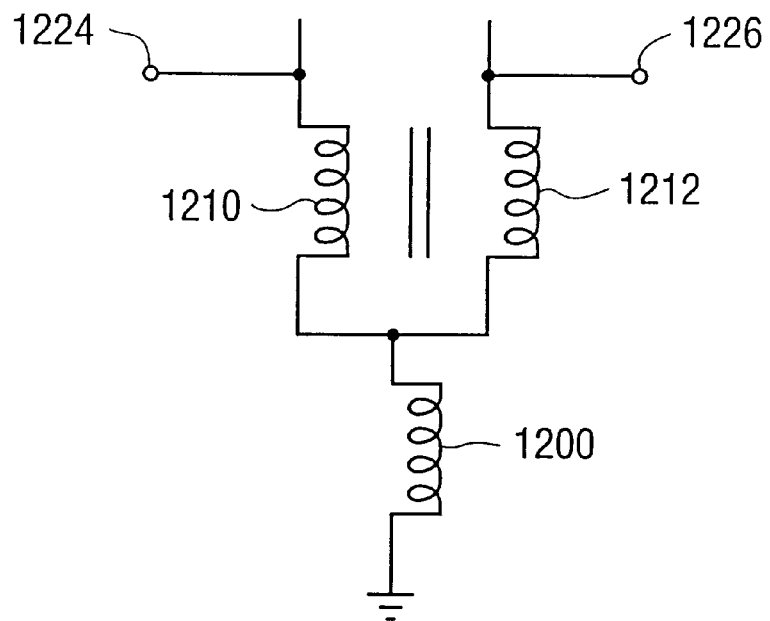
FIG. 13 shows an equivalent circuit for the components of FIG. 12.

FIG. 13 shows an equivalent circuit for the components of FIG. 12. As shown, spiral inductors 1210 and 1212 are connected to ground through inductor 1200. The inductance in the transmission line 1200 is created in substantial part due to mutual coupling from the spiral inductors 1210 and 1212. The inductor 1200, thus, serves to provide a high impedance to ground currents, and can effectively isolate inductors 1210 and 1212 from ground.

Figure 14:
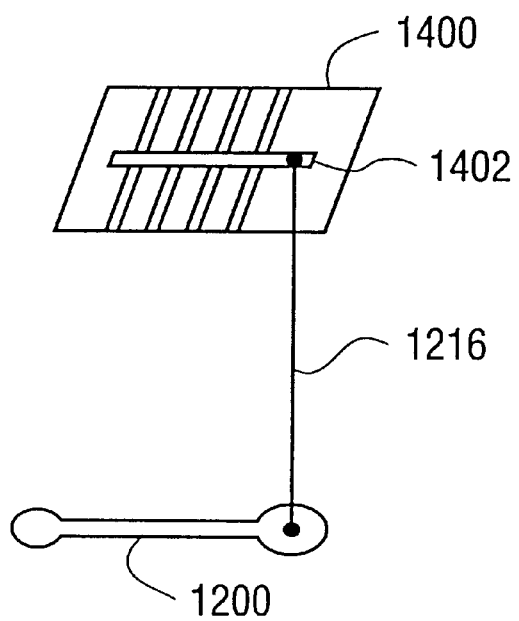
FIG. 14 shows a structure which can be included in a ground plane region of the components of FIG. 12 to control the inductance between the spiral inductors and ground.

The amount of inductance provided by line 1200 can be increased by providing an opening (not shown) in ground plane regions 1220 and 1222 for the via 1216 and connecting a lumped element inductor from the via 1216 to one of the ground plane regions. Inductance of the line 1200 can also be controlled by including a structure 1400 as shown in FIG. 14 in one of the ground plane regions 1220 or 1222. The structure 1400 includes a metal line 1402 which is connected by a via 1216 to transmission line 1200. Individual metal lines connect the line 1402 to the ground plane region. Selected ones of the individual metal lines can then be laser etched away to decrease inductive coupling by a desired amount.

Figure 15:
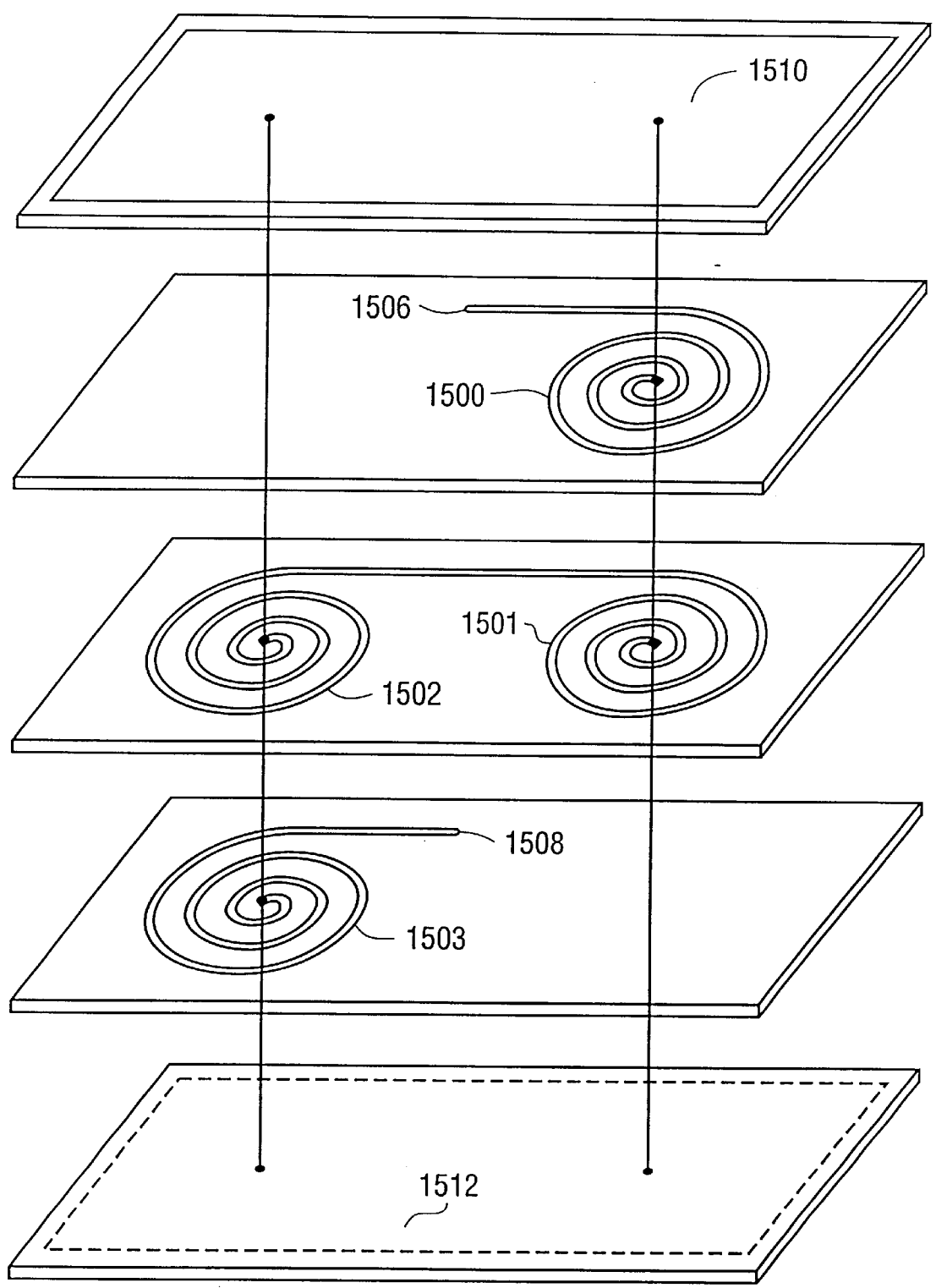
FIG. 15 is an exploded perspective view of components for an additional embodiment of the present invention which provides a filter without all of the spiral inductors being inductively coupled together.

FIG. 15 shows an additional embodiment of the present invention which provides a filter structure with stacked spiral inductors, but without all of the spiral inductors being mutually coupled together. The filter includes spiral inductors 1500 and 1501 which overlap and will experience mutual inductance, and spiral inductors 1502 and 1503 which also overlap and will have a mutual inductance. However, the spiral inductors 1500 and 1501 are separated from the spiral inductors 1502 and 1503 so that no overlap and substantially no mutual inductance occurs. Terminals 1506 and 1508 are provided for the filter by external ends of the spiral inductors 1500 and 1503, while the external ends of spiral inductors 1501 and 1502 are connected together. Internal ends of the spirals 1500–1503 are shown connected by vias to ground plane regions 1510 and 1512.

Figure 16:
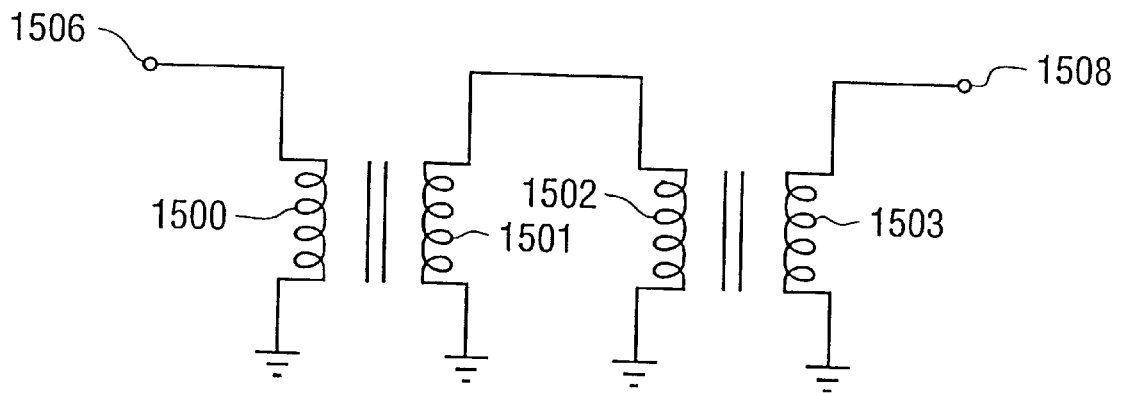
FIG. 16 shows an equivalent circuit for the components of FIG. 15.

FIG. 16 shows an equivalent circuit for the components of FIG. 15. As shown, spiral inductors 1500 and 1501 are coupled together to form a transformer. Inductors 1502 and 1503 form a separate transformer. One end of each of inductors 1500–1503 is connected to ground. A second end of each of the inductors 1500 and 1503 are connected to respective terminals 1506 and 1508. Second ends of inductors 1501 and 1502 are connected together. Although the internal ends of the spiral inductors 1500–1503 of FIG. 12 are shown connected to ground, the internal ends of inductors 1500–1503 could be connected to provide additional terminals, similar to the connections described with respect to FIG. 9. Further, additional vias could be provided from external ends of the spiral inductors 1500–1503 to openings in the ground plane regions 1510 and 1512 of FIG. 15 and lumped elements can then be connected to the vias. With external ends 1506 and 1508 connected by vias to the ground plane regions 1510 and 1512, terminals for the filter can be connected to the inductors 1500 and 1503, similar to terminals 1224 and 1226 of FIG. 12.

Figure 17:
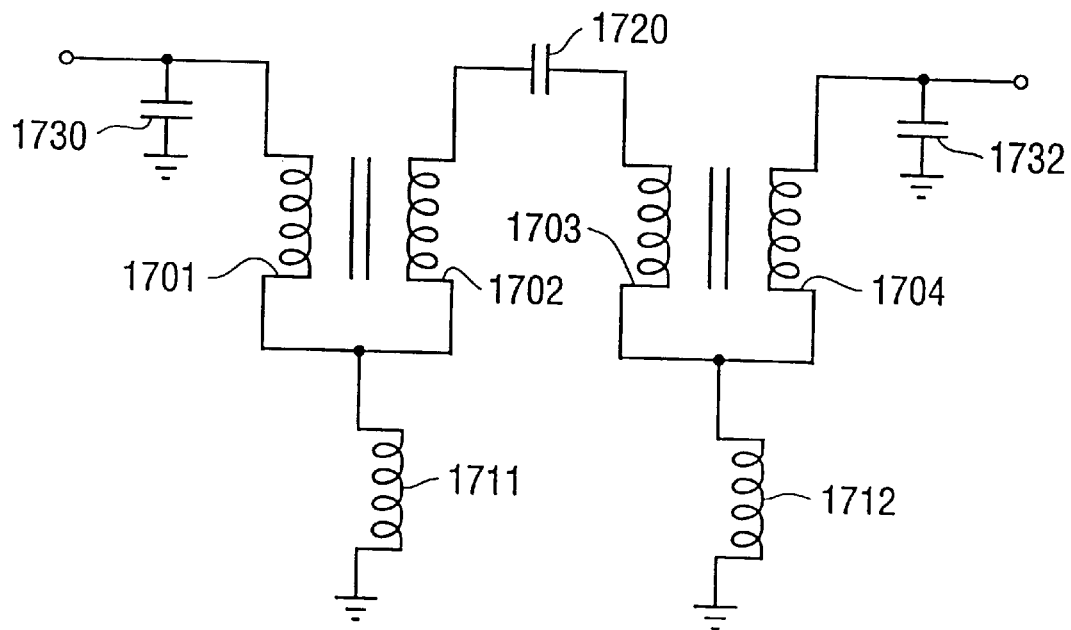
FIG. 17 shows a circuit combining components of FIGS. 12 and 15 with lumped elements attached as shown in FIGS. 2 and 3.

The present invention further contemplates that combinations of the embodiments of the present invention can be created. For example, FIG. 17 shows a circuit combining the embodiments of FIGS. 12 and 15 with lumped elements attached similar to FIGS. 2 and 3. In FIG. 17, spiral inductors 1701–1702 are used to form a first transformer, while spiral inductors 1703–1704 are used to form a second spiral inductor, similar to inductors 1500–1503 of FIG. 15. The spiral inductors 1701–1702 are connected to ground by an inductor 1711 which can be formed using a transmission line similar to line 1200 in FIG. 12. Similarly, the spiral inductors 1703–1704 are connected to ground by spiral inductor 1712. The external ends of spiral inductors 1702 and 1703 can be connected together by a lumped element 1720 similar to element 311 of FIG. 3. The external end of spiral inductor 1701 can then provide a filter terminal while being connected by a lumped element capacitor 1730 to ground similar to one of elements 211–213 of FIG. 2. Similarly, the external end of spiral inductor 1704 can provide another filter terminal while being connected by a lumped element capacitor 1732 to ground.

Although the present invention has been described above with particularity, this was merely to teach one of ordinary skill in the art how to make and use the invention. Many other modifications will fall within the scope of the invention, as that scope is defined by the claims provided below.

What is claimed is:

1. A filter comprising:

dielectric layers; and at least three spiral inductors formed between different ones of the dielectric layers, wherein the spiral inductors are located to establish mutual inductance from each one of the spiral inductors to at least one of the other spiral inductors;

ground plane regions formed on external surfaces of the dielectric layers; and a first via electrically connecting the internal ends of the spiral inductors to the ground plane regions.

2. The filter of claim 1, further comprising:

second vias electrically connecting external ends of the spiral inductors to an external surface of the dielectric layers; and first lumped elements provided on an external surface of the dielectric layers, wherein the first lumped elements electrically connect the second vias to the first via.

3. The filter of claim 2, further comprising:

second lumped elements provided on an external surface of the dielectric layers, wherein the second lumped elements electrically connect the second vias.

4. The filter of claim 3, wherein the second lumped elements comprise capacitors.

5. The filter of claim 3, wherein the second lumped elements comprise inductors.

6. The filter of claim 3, wherein the second lumped elements comprise a combination of capacitors and inductors.

7. The filter of claim 2, wherein the first lumped elements comprise capacitors.

8. The filter of claim 2, wherein the first lumped elements comprise inductors.

9. The filter of claim 2, wherein the first lumped elements comprise a combination of capacitors and inductors.

10. The filter of claim 1 further comprising:

a first transmission line electrically connected to a first one of the spiral inductors to provide an input terminal for the filter; and a second transmission line electrically connected to a second one of the spiral inductors to provide an output terminal for the filter.

11. A filter comprising:

dielectric layers;

at least three spiral inductors formed between different ones of the dielectric layers, wherein the spiral inductors are located to establish mutual inductance from each one of the spiral inductors to at least one of the other spiral inductors;

a ground plane region formed on an external surface of the dielectric layers;

a transmission line provided on one of the dielectric layers between two of the spiral inductors;

a first via electrically connecting internal ends of the spiral inductors to the transmission line;

a second via connecting the transmission line to the ground plane region; and a structure formed on a dielectric layer with the ground plane region, the structure comprising:

a second transmission line having one end connected to the second via; and a plurality of conductive lines connecting the second transmission line to the ground plane region.

12. A filter comprising:

dielectric layers; and at least three spiral inductors formed between different ones of the dielectric layers, wherein the spiral inductors are located to establish mutual inductance from each one of the spiral inductors to at least one of the other spiral inductors;

wherein the at least three spiral inductors comprise:
a first pair of spiral inductors which substantially overlap; and
a second pair of spiral inductors which substantially overlap, wherein the second pair of spiral inductors substantially do not overlap with the first pair of spiral inductors.

13. A filter comprising:
dielectric layers;
at least three spiral inductors formed between different ones of the dielectric layers, wherein the spiral inductors are located to establish mutual inductance from each one of the spiral inductors to at least one of the other spiral inductors;
a via electrically connecting the internal ends of the spiral inductors;
a first pair of transmission lines forming input terminals for the filter, one of the first pair being connected to the via, and another one of the first pair being electrically connected to a first one of the spiral inductors at a point separate from the via; and
a second pair of transmission lines forming output terminals for the filter, one of the second pair being connected to the via, and another one of the second pair being electrically connected to a second one of the spiral inductors at a point separate from the via.

14. A filter comprising:
dielectric layers;
spiral inductors formed between different ones of the dielectric layers, wherein the spiral inductors are located to establish mutual inductance from each one of the spiral inductors to at least one of the other spiral inductors;
ground plane regions formed on external surfaces of the dielectric layers; and
a first via electrically connecting the spiral inductors to the ground plane regions.

15. The filter of claim 14, wherein the first vias are connected to internal ends of the spiral inductors.

16. The filter of claim 14, further comprising:
second vias electrically connecting the spiral inductors to an external surface of the dielectric layers; and
first lumped elements provided on an external surface of the dielectric layers, wherein the first lumped elements connect the second vias to the first via.

17. The filter of claim 16, wherein the first vias are connected to internal ends of the spiral inductors and the second vias are connected to external ends of the spiral inductors.

18. The filter of claim 16, further comprising:
second lumped elements provided on an external surface of the dielectric layers, wherein the second lumped elements electrically connect the second vias.

19. The filter of claim 18, wherein the second lumped elements comprise capacitors.

20. The filter of claim 18, wherein the second lumped elements comprise inductors.

21. The filter of claim 18, wherein the second lumped elements comprise a combination of capacitors and inductors.

22. The filter of claim 16, wherein the first lumped elements comprise capacitors.

23. The filter of claim 16, wherein the first lumped elements comprise inductors.

24. The filter of claim 16, wherein the first lumped elements comprise a combination of capacitors and inductors.

25. The filter of claim 14 further comprising:
a first transmission line electrically connected to a first one of the spiral inductors to provide an input terminal for the filter; and
a second transmission line electrically connected to a second one of the spiral inductors to provide an output terminal for the filter.

26. A filter comprising:
dielectric layers;
spiral inductors formed between different ones of the dielectric layers, wherein the spiral inductors are located to establish mutual inductance from each one of the spiral inductors to at least one of the other spiral inductors;
vias electrically connecting the spiral inductors to at least one external surface of the dielectric layers; and
first lumped elements provided on at least one of the external surfaces of the dielectric layers, wherein the first lumped elements electrically connect the vias.

27. The filter of claim 26, wherein the vias connect to the external end of the spiral inductors.

28. The filter of claim 26 further comprising:
ground plane regions formed on external surfaces of the dielectric layers; and
second lumped elements electrically connecting the vias to at least one of the ground plane regions.

29. The filter of claim 28, wherein the second lumped elements comprise capacitors.

30. The filter of claim 28, wherein the second lumped elements comprise inductors.

31. The filter of claim 28, wherein the second lumped elements comprise a combination of capacitors and inductors.

32. The filter of claim 26, wherein the first lumped elements comprise capacitors.

33. The filter of claim 26, wherein the first lumped elements comprise inductors.

34. The filter of claim 26, wherein the first lumped elements comprise a combination of capacitors and inductors.

35. The filter of claim 26 further comprising:
a first transmission line electrically connected to a first one of the spiral inductors to provide an input terminal for the filter; and
a second transmission line electrically connected to a second one of the spiral inductors to provide an output terminal for the filter.

36. The filter of claim 26 further comprising:
a central via electrically connecting the internal ends of the spiral inductors;
a first pair of transmission lines forming input terminals for the filter, one of the first pair being connected to the central via, and another one of the first pair being electrically connected to a first one of the spiral inductors at a point separate from the central via; and
a second pair of transmission lines forming output terminals for the filter, one of the second pair being connected to the central via, and another one of the second pair being electrically connected to a second one of the spiral inductors at a point separate from the central via.

37. A filter comprising:
dielectric layers;
spiral inductors formed between different ones of the dielectric layers, wherein the spiral inductors are located to establish mutual inductance from each one of the spiral inductors to at least one of the other spiral inductors;

ground plane regions formed on external surfaces of the dielectric layers;

vias electrically connecting the spiral inductors to an external surface of the dielectric layers; and lumped elements provided on at least one external surface of the dielectric layers, the lumped elements electrically connecting the vias to at least one of the ground plane regions.

38. The filter of claim 37, wherein the vias connect to the external ends of the spiral inductors.

39. The filter of claim 37, wherein the lumped elements comprise capacitors.

40. The filter of claim 37, wherein the lumped elements comprise inductors.

41. The filter of claim 37, wherein the lumped elements comprise a combination of capacitors and inductors.

42. The filter of claim 37 further comprising:

a first transmission line electrically connected to a first one of the spiral inductors to provide an input terminal for the filter; and a second transmission line electrically connected to a second one of the spiral inductors to provide an output terminal for the filter.

43. The filter of claim 37 further comprising:

a central via electrically connecting the internal ends of the spiral inductors;

a first pair of transmission lines forming input terminals for the filter, one of the first pair being connected to the central via, and another one of the first pair being electrically connected to a first one of the spiral inductors at a point separate from the central via; and a second pair of transmission lines forming output terminals for the filter, one of the second pair being connected to the central via, and another one of the second pair being electrically connected to a second one of the spiral inductors at a point separate from the central via.

44. A filter comprising:

dielectric layers;

spiral inductors formed between different ones of the dielectric layers, wherein the spiral inductors are located to establish mutual inductance from one of the spiral inductors to another;

a ground plane region formed on an external surface of the dielectric layers;

a transmission line provided on one of the dielectric layers between two of the spiral inductors;

a first via electrically connecting the spiral inductors to the transmission line; and a second via coupling the transmission line to the ground plane region.

45. The filter of claim 44, wherein the first via is connected to internal ends of the spiral inductors.

46. The filter of claim 44, wherein the first via is further connected to a ground plane region.

47. The filter of claim 44 further comprising a structure formed on a dielectric layer with the ground plane region, the structure comprising:

a second transmission line having one end connected to the second via; and a plurality of conductive lines connecting the second transmission line to the ground plane region.

48. The filter of claim 44 further comprising:

a first transmission line electrically connected to a first one of the spiral inductors to provide an input terminal for the filter; and a second transmission line electrically connected to a second one of the spiral inductors to provide an output terminal for the filter.

49. A filter comprising:

dielectric layers;

a first pair of spiral inductors formed on different ones of the dielectric layers and substantially overlapping to establish mutual inductance; and a second pair of spiral inductors formed on different ones of the dielectric layers and substantially overlapping to establish mutual inductance, wherein the second pair of spiral inductors substantially do not overlap with the first pair of spiral inductors.

50. The filter of claim 49 further comprising:

a ground plane region formed on an external surface of the dielectric layers, wherein internal ends of the first and second pair of spiral inductors are connected by vias to the ground plane regions; and a pair of transmission lines forming terminals for the filter, one of the pair of transmission lines being connected to an external end of a first one of the first pair of spiral inductors, another one of the pair of transmission lines being connected to an external end of a first one of the second pair of spiral inductors, wherein an external end of a second one of the first pair of spiral inductors is connected to an external end of a second one of the second pair of spiral inductors.

* * * * *